(12) United States Patent
Lu

(10) Patent No.: US 12,501,723 B2
(45) Date of Patent: Dec. 16, 2025

(54) DISPLAY PANEL AND MOBILE TERMINAL

(71) Applicant: SHENZHEN CHINA STAR OPTOELECTRONICS SEMICONDUCTOR DISPLAY TECHNOLOGY CO., LTD., Guangdong (CN)

(72) Inventor: Zhitao Lu, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 728 days.

(21) Appl. No.: 17/759,371

(22) PCT Filed: Jul. 7, 2022

(86) PCT No.: PCT/CN2022/104384
§ 371 (c)(1),
(2) Date: Jul. 24, 2022

(87) PCT Pub. No.: WO2023/245738
PCT Pub. Date: Dec. 28, 2023

(65) Prior Publication Data
US 2024/0186338 A1  Jun. 6, 2024

(30) Foreign Application Priority Data
Jun. 21, 2022 (CN) .......................... 202210709085.5

(51) Int. Cl.
*H10F 39/10* (2025.01)

(52) U.S. Cl.
CPC ................................ *H10F 39/103* (2025.01)

(58) Field of Classification Search
CPC ............... H10F 39/103; H10F 39/8037; H10F 39/8063; H10F 39/811
See application file for complete search history.

(56) References Cited

U.S. PATENT DOCUMENTS

| 2006/0163575 | A1* | 7/2006 | Shih .................... H10F 39/8063 257/E31.128 |
| 2016/0013243 | A1 | 1/2016 | O'Rourke et al. |
| 2019/0045111 | A1* | 2/2019 | Galor Gluskin ..... H04N 23/815 |

FOREIGN PATENT DOCUMENTS

| CN | 103092428 A | 5/2013 |
| CN | 108803932 A | 11/2018 |

(Continued)

OTHER PUBLICATIONS

International Search Report in International application No. PCT/CN2022/104384, mailed on Nov. 25, 2022.

(Continued)

*Primary Examiner* — Sitaramarao S Yechuri
(74) *Attorney, Agent, or Firm* — PV IP PC; Wei Te Chung

(57) ABSTRACT

A display panel and a mobile terminal are provided. A photosensitive module of the display panel includes a photosensitive transistor and a light-concentrating structure. A first active layer of the photosensitive transistor includes a first channel portion. A first source-drain electrode layer is disposed on the first active portion which is disposed on two sides of the first channel portion. The light-concentrating structure includes at least one protrusion protruded along a direction that the photosensitive transistor away from a substrate of the display panel. In a direction of a top view of the display panel, the light-concentrating structure covers at least the first channel portion of the first active layer.

18 Claims, 4 Drawing Sheets

(56) References Cited

FOREIGN PATENT DOCUMENTS

| CN | 110728266 A | 1/2020 |
|---|---|---|
| CN | 110854298 A | 2/2020 |
| CN | 112599630 A | 4/2021 |
| CN | 113189821 A | 7/2021 |

OTHER PUBLICATIONS

Written Opinion of the International Search Authority in International application No. PCT/CN2022/104384, mailed on Nov. 25, 2022.
Chinese Office Action issued in corresponding Chinese Patent Application No. 202210709085.5 dated May 21, 2025, pp. 1-6.

\* cited by examiner

DISPLAY PANEL AND MOBILE TERMINAL

FIELD OF INVENTION

The present application relates to a field of display technology, and in particular, to a display panel and a mobile terminal.

BACKGROUND OF INVENTION

Display panels are widely used in various fields of society, where a demand for interactive display technology is increasing day by day. The currently light control sensor integrated into the display panel and the laser as the control source is an interactive technology that can achieve precise remote control.

The currently light control sensor usually includes a photosensitive transistor, a switch transistor, and a readout module. A photocurrent generated by the photosensitive transistor under a photosensitive condition is introduced into the readout module to obtain an optical signal when a source electrode and a drain electrode of the switch transistor are turned on. However, the currently photosensitive transistors receive less light in per unit time, and a photosensitivity of the currently light control sensor is poor.

SUMMARY OF INVENTION

The present application provides a display panel and a mobile terminal to solve a technical problem of poor photosensitivity of light control sensor in currently display panel.

The present application provides a display panel, which includes a photosensitive module and a readout module connected to the photosensitive module, wherein the photosensitive module includes:
  a photosensitive transistor including a first active layer and a first source-drain electrode layer positioned on the first active layer, wherein the first active layer includes a first channel portion and a first active portion positioned on two sides of the first channel portion, and wherein the first source-drain electrode layer is disposed on the first active portion which is disposed on two sides of the first channel portion;
  a switch transistor connected to the photosensitive transistor and the readout module;
  a first capacitor connected to the photosensitive transistor and the switch transistor; and
  a light-concentrating structure disposed on the photosensitive transistor, wherein the light-concentrating structure includes at least one protrusion protruded along a direction that the photosensitive transistor away from a substrate of the display panel;
  wherein in a direction of a top view of the display panel, the light-concentrating structure covers at least the first channel portion of the first active layer.

The present application also proposes a mobile terminal, which includes a terminal body and a display panel, wherein the terminal body and the display panel are combined into one, and wherein the display panel includes a photosensitive module and a readout module connected to the photosensitive module, wherein the photosensitive module includes:
  a photosensitive transistor including a first active layer and a first source-drain electrode layer positioned on the first active layer, wherein the first active layer includes a first channel portion and a first active portion positioned on two sides of the first channel portion, and wherein the first source-drain electrode layer is disposed on the first active portion which is disposed on two sides of the first channel portion;
  a switch transistor connected to the photosensitive transistor and the readout module;
  a first capacitor connected to the photosensitive transistor and the switch transistor; and
  a light-concentrating structure disposed on the photosensitive transistor, wherein the light-concentrating structure includes at least one protrusion protruded along a direction that the photosensitive transistor away from a substrate of the display panel;
  wherein in a direction of a top view of the display panel, the light-concentrating structure covers at least the first channel portion of the first active layer.

In the present application, a light-concentrating structure is arranged on the photosensitive transistor of the photosensitive module, so that the light passing through the light-concentrating structure is concentrated on the channel portion of the photosensitive transistor, thereby increasing a total amount of light received by the photosensitive transistor and improving a photosensitivity of the photosensitive transistor.

DETAILED DESCRIPTION OF EMBODIMENTS

Figure 1:
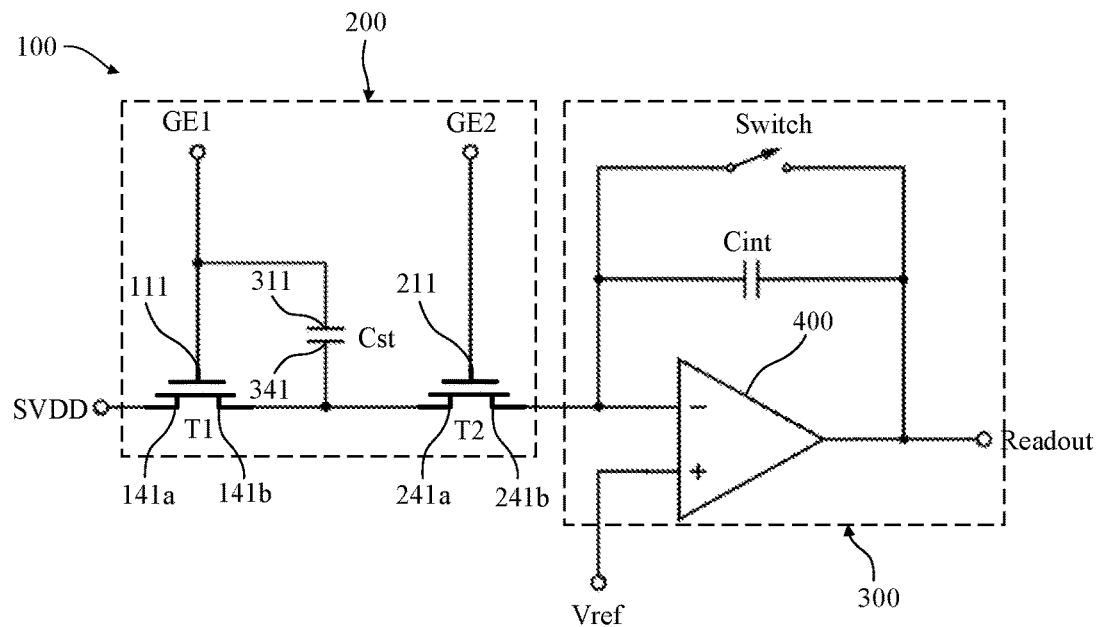
FIG. 1 is a circuit structure diagram of a photosensitive module and a readout module in a display panel of the present application.

In order to make the objectives, technical solutions and effects of the present application clearer and more specific, the present application will be further described in detail below with reference to the accompanying figures and examples. It should be understood that the specific embodiments described herein are only used to explain the present application, but not to limit the present application.

Referring to FIGS. 1 to 7, the present application provides a display panel 100, which includes a photosensitive module 200 and a readout module 300 connected to the photosensitive module 200. The photosensitive module 200 includes:
  a photosensitive transistor T1 including a first active layer 131 and a first source-drain electrode layer 141 positioned on the first active layer 131, wherein the first active layer 131 includes a first channel portion 131a and a first active portion 131b positioned on two sides of the first channel portion 131a, and wherein the first source-drain electrode layer 141 is disposed on the first active portion 131b which is disposed on two sides of the first channel portion 131a;

a switch transistor T2 connected to the photosensitive transistor T1 and the readout module 300;

a first capacitor Cst connected to the photosensitive transistor T1 and the switch transistor T2; and a light-concentrating structure 160 disposed on the photosensitive transistor T1, wherein the light-concentrating structure 160 includes at least one protrusion protruded along a direction that the photosensitive transistor T1 away from a substrate 10 of the display panel 100;

wherein in a direction of a top view of the display panel 100, the light-concentrating structure 160 covers at least the first channel portion 131a of the first active layer 131.

In the present application, by disposing the light-concentrating structure 160 on the photosensitive transistor T1 of the photosensitive module 200, the light incident on the display panel 100 is concentrated in the channel portion of the photosensitive transistor T1 through the light-concentrating structure 160, thereby increasing a total amount of light received by the photosensitive transistor T1 in per unit time, and increasing the light sensitivity of the photosensitive transistor T1.

In this embodiment, please refer to FIG. 1, the first gate electrode 111 of the photosensitive transistor T1 can be connected to a first control signal line GE1, a first electrode of the photosensitive transistor T1 is connected to a first power supply line SVDD, and a second electrode of the photosensitive transistor T1 is connected to the first electrode of the switch transistor T2. A second gate electrode 211 of the switch transistor T2 is connected to the second control signal line GE2. A second electrode of the switch transistor T2 is connected to the readout module 300. The first capacitor Cst includes a first electrode plate 341 and a second electrode plate 311. The first electrode plate 341 and the second electrode of the photosensitive transistor T1 are connected to the first electrode of the switch transistor T2, the second electrode plate 311 is connected to the first control signal line GE1.

In this embodiment, the first electrode of the photosensitive transistor T1 is one of a drain electrode or a source electrode, the second electrode of the photosensitive transistor T1 is the other one of the drain electrode or the source electrode. The first electrode of the switch transistor T2 is one of the drain electrode or the source electrode. The second electrode of the switch transistor T2 is the other of the drain electrode or the source electrode. For example, the first electrodes of the photosensitive transistor T1 and the switch transistor T2 are both source electrodes, and the second electrodes of the photosensitive transistor T1 and the switch transistor T2 are both drain electrodes.

In this embodiment, the photosensitive module 200 may be disposed in a sub-pixel of the display panel 100, and is used to realize functions such as touch control, fingerprint recognition, and long-distance optical interaction by sensing changes in light intensity.

In this embodiment, please refer to FIG. 1, the readout module 300 may include: an operational amplifier 400. The operational amplifier 400 includes an inverting input terminal, a non-inverting input terminal, and an output terminal (as indicated by the "operational amplifier 400 shown in FIG. 1. "−" represents the inverting input terminal, "+" represents the non-inverting input terminal). The non-inverting input terminal is connected to a comparison voltage terminal Vref. The inverting input terminal is connected to the second electrode of the switch transistor T2. A read-out capacitor Cint is connected in parallel with the operational amplifier 40. A first switch Switch is connected in parallel with the operational amplifier 400 and the readout capacitor Cint. A first terminal of the readout capacitor Cint and a first terminal of the first switch Switch are connected to the inverting input terminal of the operational amplifier 400. A second terminal of the readout capacitor Cint and the second terminal of the first switch Switch are connected to the output terminal of the operational amplifier 400. The output terminal of the operational amplifier 400 is also connected to a readout line Readout. The readout line Readout is used to output a light sensing signal.

In this embodiment, the readout capacitor Cint is an integrating capacitor.

The technical solutions of the present application will now be described with reference to specific embodiments.

Figure 2:
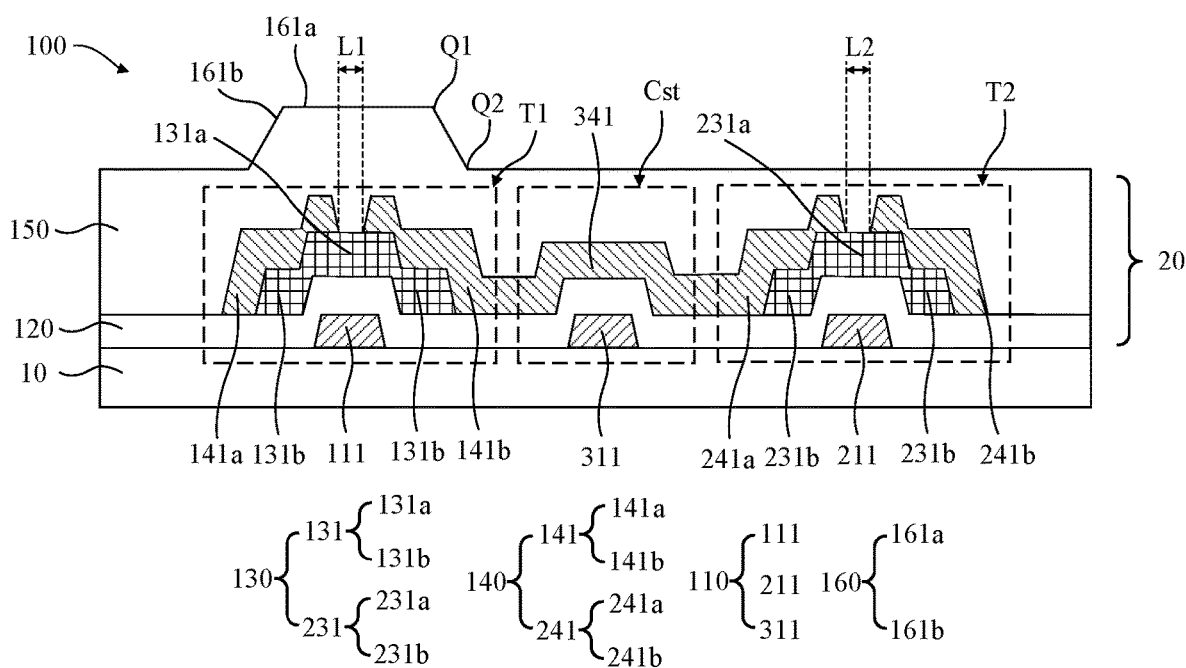
FIG. 2 is a structural diagram of a first film layer of the photosensitive module shown in the display panel of the present application.

Please refer to FIG. 2, FIG. 2 is a cross-sectional view of the photosensitive module 200 in the display panel 100 of the present application. The display panel 100 may include a substrate 10 and a thin film transistor layer 20 disposed on the substrate 10.

In this embodiment, a material of the substrate 10 can be made of materials such as glass, quartz, or polyimide. The thin film transistor layer 20 includes a plurality of thin film transistors.

In this embodiment, the thin film transistor may be of an etch stop type, a back channel etch type, etc., which is not specifically limited.

In the display panel 100 of the present application, please refer to FIG. 2, the thin film transistor layer 20 may include:

A first metal layer 110 is disposed on the substrate 10. The first metal layer 110 may include a plurality of gate lines, and a first gate electrode 111 of the photosensitive transistor T1, a second gate 211 of the switch transistor T2, and a second electrode plate 311 of the first capacitor Cst which are constitute the photosensitive transistor T1. A material of the first metal layer 110 may be copper, molybdenum or molybdenum-titanium alloy or the like.

A gate insulating layer 120 is disposed on the first metal layer 110. The gate insulating layer 120 covers the first metal layer 110, to separate the first metal layer 110 and a conductive layer on the gate insulating layer 120. A material of the layer 120 may be silicon oxide or the like.

An active material layer 130 is disposed on the gate insulating layer 120. A material of the active material layer 130 can be indium gallium zinc oxide (IGZO), amorphous silicon (a-Si) or low temperature polysilicon (LTPS). For example, the material of the active material layer 130 in FIG. 2 may be a-Si.

In this embodiment, the active material layer 130 includes a first active layer 131 constituting the photosensitive transistor T1 and a second active layer 231 constituting the switch transistor T2. The first active layer 131 includes a first channel portion 131a and the first active portion 131b positioned on both sides of the first channel portion 131a. The second active layer 231 includes a second channel portion 231a and a second active portion 231b positioned on both sides of the second channel portion 231a.

A second metal layer 140 is disposed on the active material layer 130. The second metal layer 140 may include a plurality of data lines, a first electrode plate 341 of the first capacitor Cst, a first source-drain electrode layer 141 that constitutes the photosensitive transistor T1, and a second source-drain electrode layer 241 that constitutes the switch transistor T2.

In this embodiment, the first source-drain electrode layer 141 includes a first source electrode 141a and a first drain electrode 141b which are separated from each other. The first source electrode 141a and the first drain electrode 141b are overlapped and cover the first active portion 131b of the first active layer 131. The first channel portion 131a is not covered by the first source electrode 141a and the first drain electrode 141b. The second source-drain electrode layer 241 includes a second source electrode 241a and a second drain electrode 241b which are separated from each other. The second source electrode 241a and the second drain electrode 241b are overlapped and cover the second active portion 231b of the second active layer 231. The second channel portion 231a is not covered by the second source electrode 241a and the second drain electrode 241b.

In this embodiment, the first source electrode 141a is a first electrode of the photosensitive transistor T1, the first drain electrode 141b is a second electrode of the photosensitive transistor T1. The second source electrode 241a is a first electrode of the switch transistor T2. The second drain electrode 241b is a second electrode of the switch transistor T2.

In this embodiment, a material of the second metal layer 140 may be copper/molybdenum-titanium alloy, copper/titanium, or the like.

The protective layer 150 is disposed on the second metal layer 140. The protective layer 150 covers the second metal layer 140, to separate the second metal layer 140 and a conductive layer on the protective layer 150. A material of the protective layer 150 can be composed of inorganic materials combined with oxynitride silicon or organic materials with flatness.

In this embodiment, the protective layer 150 is further provided with a light-concentrating structure 160 opposite to the photosensitive transistor T1. The protective layer 150 may be patterned to form a protective layer 150 with the light-concentrating structure 160 when the protective layer 150 is formed.

Figure 3:
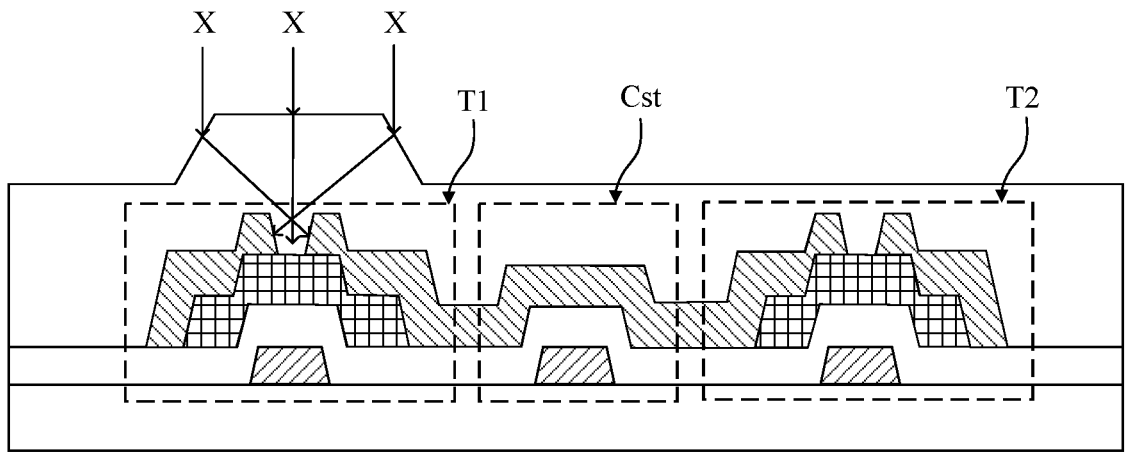
FIG. 3 is an optical schematic diagram of the photosensitive transistor shown in FIG. 2.

In the display panel 100 of the present application, please refer to FIG. 2 and FIG. 3, the light light-concentrating structure 160 includes a light-concentrating plane 161a and a light-concentrating inclined plane 161b connected to the light-concentrating plane 161a. A first terminal Q1 of the light-concentrating inclined plane 161b is disposed away from the photosensitive transistor T1, a second terminal Q2 of the light-concentrating inclined plane 161b is disposed close to the photosensitive transistor T1. The first terminal Q1 of the light-concentrating inclined plane 161b is connected to the light-concentrating plane 161a.

In this embodiment, in the direction of the top view of the display panel 100, the light-concentrating plane 161a covers at least the first channel portion 131a of the first active layer 131.

Referring to FIG. 2 and FIG. 3, the light-concentrating structure 160 may be a protruding platform from the protective layer 150. Among the light incident on the light-concentrating structure 160, the first light rays X penetrating the light-concentrating plane 161a will be vertically incident on the photosensitive transistor T1 and irradiated on the first channel portion 131a of the photosensitive transistor T1. For the second light Y penetrating the light-concentrating inclined plane 161b, the light passing through the light-concentrating inclined plane 161b is refracted under the action of light refraction, and irradiated into the first channel portion 131a of the photosensitive transistor T1.

In this embodiment, since an opening area of the first channel portion 131a is limited to a certain extent, if an area of the light-concentrating plane 161a is smaller than an area of the first channel portion 131a, it can be considered that the first channel portion 131a is not covered by the light-concentrating plane 161a, the light incident on the uncovered region of the first channel portion 131a may cannot be effectively incident into the first channel portion 131a due to the refraction of light, which reduces an total amount of light received by the photosensitive transistor T1 in per unit time, and reduces a light sensitivity of the photosensitive transistor T1.

In this embodiment, the protruding platform light-concentrating structure 160 is arranged so that the light incident on the light-concentrating plane 161a is vertically incident on the first channel portion 131a, and the light incident on the light-concentrating inclined plane 161b will be concentrated into the first channel portion 131a by a refraction of the light, thereby increasing an total amount of light received by the photosensitive transistor T1 in per unit time, and improving the light sensitivity of the photosensitive transistor T1.

Figure 4:
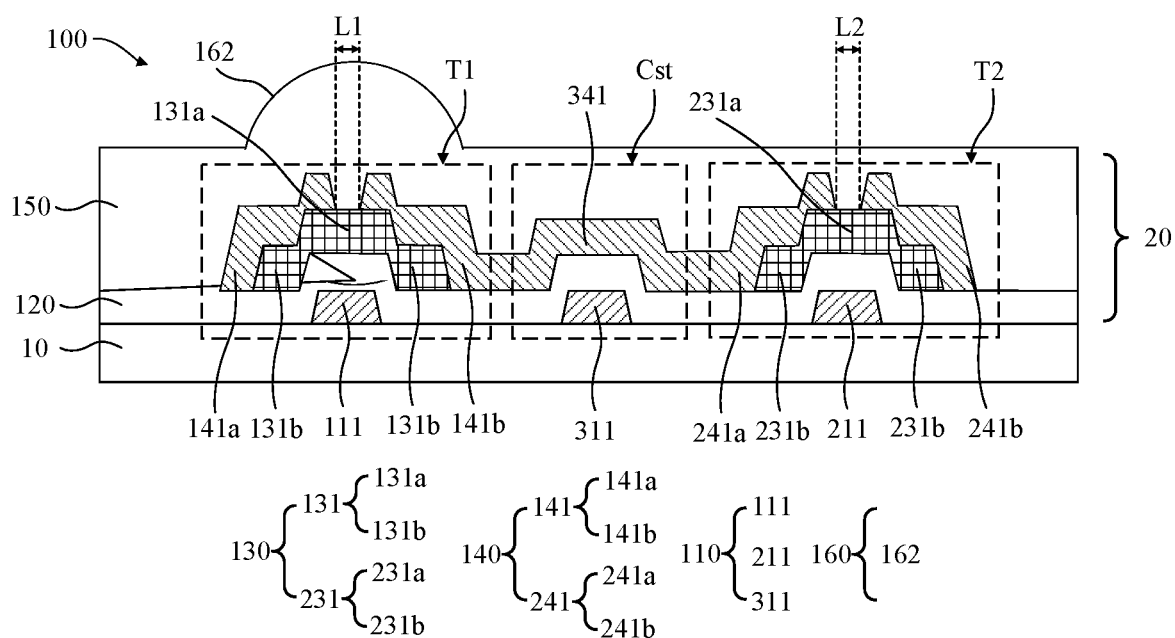
FIG. 4 is a structural diagram of a second film layer of the photosensitive module in the display panel of the present application.
Figure 5:
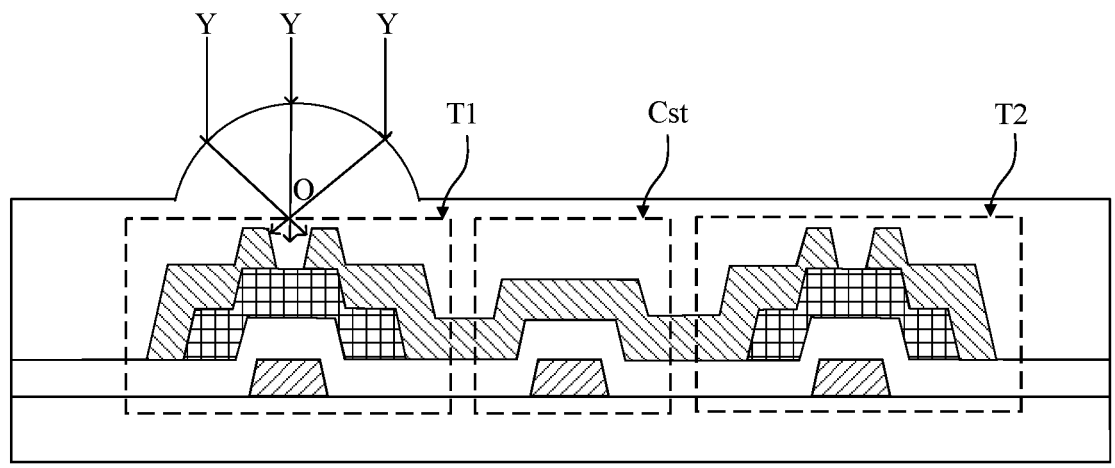
FIG. 5 is an optical schematic diagram of the photosensitive transistor shown in FIG. 4.

In the display panel 100 of the present application, please refer to FIG. 4 and FIG. 5, the light light-concentrating structure 160 includes a light-concentrating arc surface 162. A protruding direction of the light-concentrating arc surface 162 is away from the photosensitive transistor T1. In a direction of the top view of the display panel 100, an orthographic projection of the focus point O of the light-concentrating arc surface 162 on the first channel portion 131a is positioned in the first channel portion 131a.

In this embodiment, the light-concentrating structure 160 may be a convex circle formed on the protective layer 150. The light incident on the light-concentrating structure 160 penetrates the light-concentrating arc surface 162 and is refracted to be concentrated on the focal point O of the light-concentrating arc surface 162, and incident on the first channel portion 131a of the photosensitive transistor T1 through the focal point O.

Compared with the structure in FIG. 2, the structure in FIG. 4 can concentrate the light incident on the light-concentrating arc surface 162 on the focus point O of the light-concentrating arc surface 162, while the structure in FIG. 2 can only refract the light incident on the light-concentrating inclined plane 161b into the photosensitive transistor T1 at a same angle, so a concentrating effect in FIG. 4 is better than a concentrating effect in FIG. 3.

In this embodiment, since the light incident on the light-concentrating arc surface 162 will be concentrated on the focal point O of the light-concentrating arc surface 162, that is the focus point O of the light-concentrating arc surface 162 only needs to be set above the first channel portion 131a, a certain light-concentrating effect can be achieved, the focus point O of the light-concentrating arc surface 162 as shown in FIG. 4 may be disposed outside a cavity formed by the first channel portion 131a, the first source electrode 141a, and the second source electrode 241a.

In this embodiment, the light-concentrating surface of the light-concentrating structure 160 is set as an arc surface, so that the light incident on the light-concentrating arc surface 162 is all concentrated on the focal point O of the light-concentrating arc surface 162, and at the same time, the focal point Q is disposed on the first channel portion 131a, therefore, the light passing through the light-concentrating arc surface 162 can be incident into the first channel portion 131a as much as possible, which increases the total amount of light received by the photosensitive transistor T1 in per unit time, and improves a light sensitivity of photosensitive transistor T1.

Figure 6:
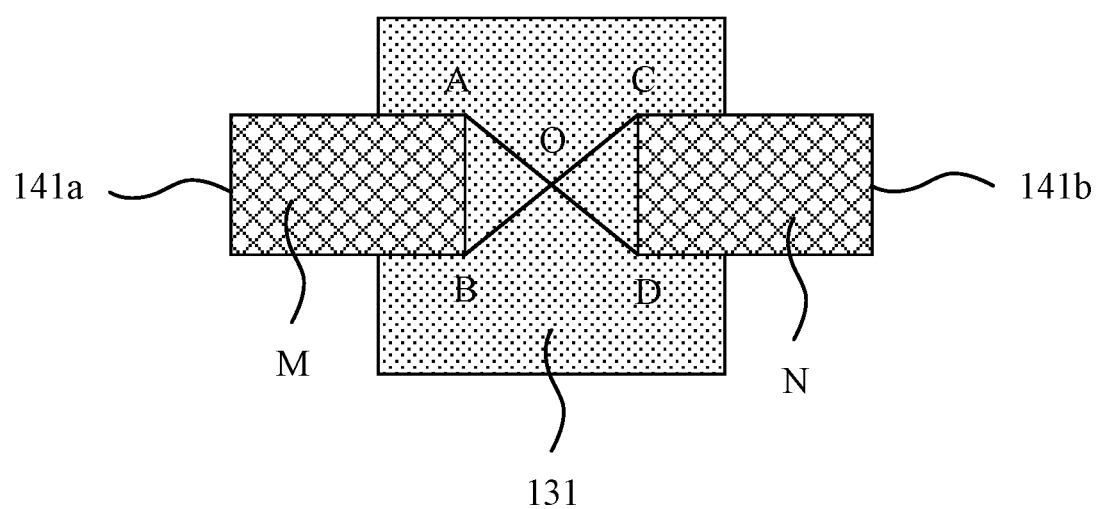
FIG. 6 is a partial top plan view of the photosensitive transistor shown in FIG. 4.

In the display panel 100 of the present application, please refer to FIG. 6, the first source-drain electrode layer 141 includes a first source electrode 141a and a first drain electrode 141*b* which are disposed separately. The first source electrode 141*a* includes a first surface M away from the first active layer 131, and the first drain electrode 141*b* includes a second surface N away from the first active layer 131.

In this embodiment, the focal point O of the light-concentrating arc surface 162 coincides with the plane where the first surface M or/and the second surface N is positioned. Please refer to FIG. 6, a side of the first surface M close to the second surface N is a boundary line AB, a side of the second surface N close to the first surface M is a boundary line CD. The first surface M and the second surface N may be located at a same plane, and the focus point O of the light-concentrating arc surface 162 can be coincident with a plane ABCD.

In this embodiment, if the focus point O of the light-concentrating arc surface 162 is positioned between the plane ABCD and the light-concentrating arc surface 162, there may be some incident light rays irradiating on the first surface M or the second surface N. The focal point O of the light-concentrating arc surface 162 is positioned between the plane ABCD and the first channel portion 131*a*, so that a distance between the light-concentrating arc surface 162 and the first channel portion 131*a* is too small, resulting in that a curvature of the light-concentrating arc surface 162 is too large, and the light-concentrating arc surface 162 cannot be set with a small curvature. That is, the light-concentrating arc surface 162 with a large radius cannot be set, resulting in that an area of the light-concentrating arc surface 162 is too small, a total amount of light received by the photosensitive transistor T1 per unit time is reduced, and the light sensitivity of the photosensitive transistor T1 is weakened. Therefore, setting the focus point O of the light-concentrating arc surface 162 on the plane ABCD can maximize the total amount of light received by the first channel portion 131*a* in per unit time, and improve the light sensitivity of photosensitive transistor T1.

In this embodiment, please refer to FIG. 6, the focal point O of the light-concentrating arc surface 162 may coincide with a center point of the plane ABCD.

In the above-mentioned embodiment, in order to ensure that the light is concentrated in the first channel portion 131*a* by the light-concentrating structure 160, a refractive index of other film layer materials disposed on the protective layer 150 needs to be greater than a refractive index of the protective layer 150, which is equivalent to the high-refractive-index film layer enters the low-refractive-index film layer to avoid total reflection and improve the light-concentrating effect of the light-concentrating structure 160.

In this embodiment, please refer to FIG. 2 and FIG. 4, in the top view direction of the display panel 100, a length L1 of the first channel portion 131*a* is greater than a length L2 of the second channel portion 231*a*.

In this embodiment, since a photosensitivity of the photosensitive transistor T1 is positively correlated with the total amount of light received by the first channel portion 131*a* in per unit time, the longer the length L1 of the first channel portion 131*a*, the better the light sensitivity of the photosensitive transistor T1. Within an allowable size range, the length L1 of the first channel portion 131*a* can be increased as much as possible, which can improve the photosensitivity of the photosensitive transistor T1.

Figure 7:
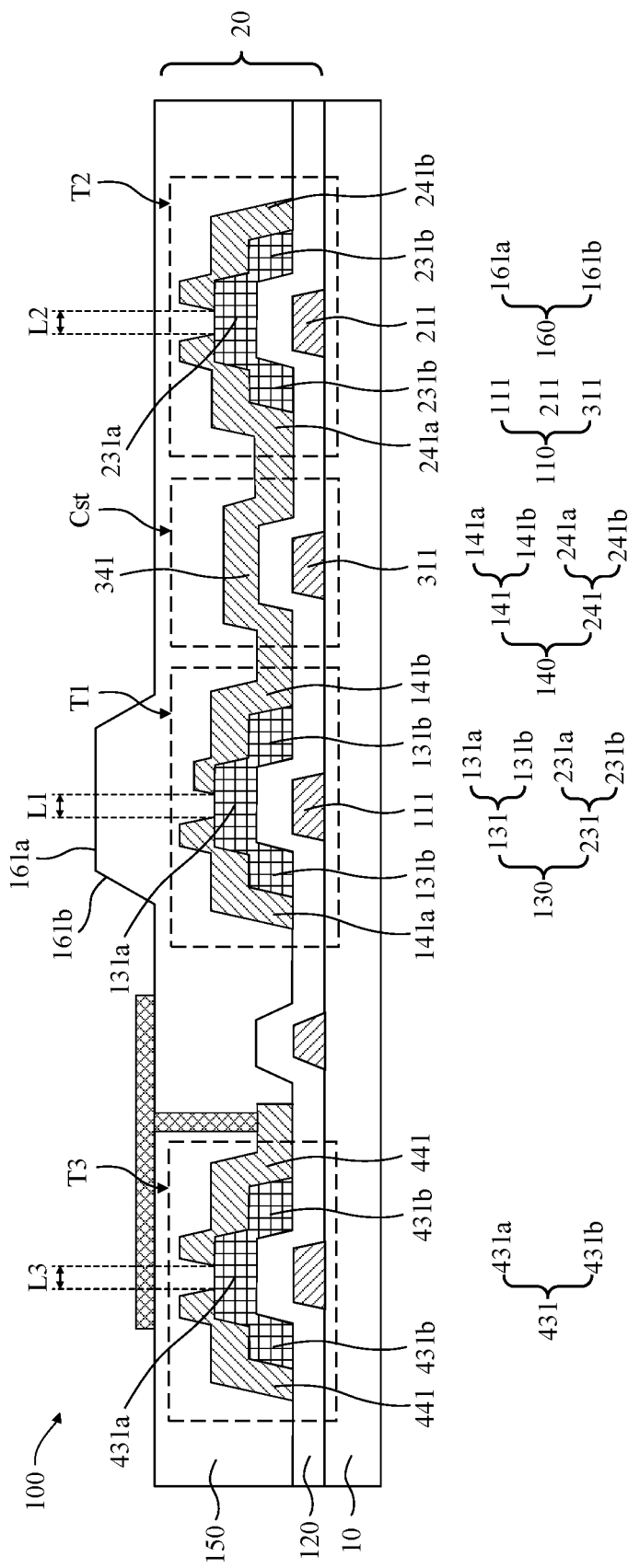
FIG. 7 is a third film structure diagram of the photosensitive module in the display panel of the present application.

In the display panel 100 of the present application, please refer to FIG. 7, the display panel 100 further includes a display transistor T3. The display transistor T3 includes a third active layer 431. The third active layer 431 includes a third channel portion 431*a* and a third active portion 431*b* positioned on two sides of the third channel portion 431*a*. The third channel portion 431*a* and the third source-drain electrode layer 441 in the display transistor T3 are provided non-overlapping.

In this embodiment, in the direction of the top view of the display panel 100, the length L1 of the first channel portion 131*a* may be greater than a length L3 of the third channel portion 431*a*. Similar to the structures of FIG. 2 and FIG. 4, the second channel portion 231*a* is the active layer of the switch transistor T2, the third channel portion 431*a* is the active layer of the display transistor T3, and the display transistor T3 and the switch transistor T2 only serve as the active layer. The length of the channel portion is only related to the turn-on rate of the display transistor and the switch transistor T2. Therefore, in this embodiment, within an allowable size range, by limiting the length L3 of the second channel portion 231*a* and the third channel portion 431*a*, and increasing the length L1 of the first channel portion 131*a*, and an area of the first active layer 131 for receiving light is increased, thereby improving the photosensitivity of the photosensitive transistor T1.

Referring to FIG. 7, the first source electrode 141*a* is disposed close to the display transistor T3, and the first drain electrode 141*b* is disposed away from the display transistor T3. In a direction from the photosensitive transistor T1 to the light-concentrating structure, a thickness of the first source electrode 141*a* is greater than a thickness of the first drain electrode 141*b*.

In this embodiment, the thickness of the first source electrode 141*a* is increased, so that the first source electrode 141*a* can be used as a blocking wall, and the light irradiated on a side surface of the first source electrode 141*a* can be reflected into the first channel portion 131*a*, thereby increasing the total amount of light received by the photosensitive transistor T1 and improving the light sensitivity of the photosensitive transistor T1. At the same time, the light reflected to the display transistor through the first source electrode 141*a* can be blocked to ensure a performance of the display transistor.

In the display panel 100 of the present application, the display panel 100 can be divided into a display stage and a light-sensing stage within one frame time, the photosensitive module 200 is used to work in the light-sensing stage, and the display unit is used to work in the display stage. The display panel 100 with the photosensitive module 200 can realize functions such as touch control, fingerprint recognition, long-distance optical interaction, etc. At the same time, integrating the photosensitive module 200 into the display panel 100 can also reduce an overall thickness of the display panel 100.

The present application also proposes a mobile terminal, which includes a terminal body and the above-mentioned display panel, wherein the terminal body and the display panel are combined into one body. The terminal body may be a device such as a circuit board bound to the display panel and a cover plate or the like covering the display panel. The mobile terminal may include electronic devices such as a mobile phone, a TV, and a notebook computer.

It can be understood that, for those of ordinary skill in the art, equivalent replacements or changes can be made according to the technical solutions of the present application and the inventive concept thereof. All these changes or replacements should belong to a protection scope of the appended claims of the present application.

What is claimed is:

1. A display panel, comprising a photosensitive module and a readout module connected to the photosensitive module, wherein the photosensitive module comprises:
a photosensitive transistor comprising a first active layer and a first source-drain electrode layer positioned on the first active layer, wherein the first active layer comprises a first channel portion and first active portions respectively positioned on two sides of the first channel portion, and the first source-drain electrode layer is disposed on the first active portions;
a switch transistor connected to the photosensitive transistor and the readout module;
a first capacitor connected to the photosensitive transistor and the switch transistor; and
a light-concentrating structure disposed on the photosensitive transistor, wherein the light-concentrating structure comprises at least one protrusion protruding in a direction from a substrate of the display panel to the photosensitive transistor;
wherein an orthographic projection of the light-concentrating structure on the substrate covers at least an orthographic projection of the first channel portion on the substrate;
wherein the display panel further comprises a display transistor comprising a third active layer and a third source-drain electrode layer disposed on the third active layer, the third active layer comprises a third channel portion and third active portions respectively positioned on two sides of the third channel portion, and the third source-drain electrode layer does not overlap the third channel portion; and
wherein the first source-drain electrode layer comprises a first source electrode and a first drain electrode separate from each other, the first source electrode is disposed close to the display transistor, and the first drain electrode is disposed away from the display transistor.

2. The display panel according to claim 1, wherein the at least one protrusion comprises a light-concentrating plane and a light-concentrating inclined plane connected with the light-concentrating plane, the light-concentrating inclined plane has a first terminal disposed away from the photosensitive transistor and a second terminal disposed close to the photosensitive transistor, and the first terminal is connected to the light-concentrating plane; and
wherein an orthographic projection of the light-concentrating plane on the substrate covers at least the orthographic projection of the first channel portion on the substrate.

3. The display panel according to claim 1, wherein the switch transistor comprises a second active layer and a second source-drain electrode layer, the second active layer comprises a second channel portion and second active portions respectively positioned on two sides of the second channel portion, and the second source-drain electrode layer does not overlap the second channel portion; and
wherein a length of the first channel portion is greater than a length of the second channel portion.

4. The display panel according to claim 1,
wherein a length of the first channel portion is greater than a length of the third channel portion.

5. The display panel according to claim 1, wherein a thickness of the first source electrode is greater than a thickness of the first drain electrode in the direction from the substrate to the photosensitive transistor.

6. The display panel according to claim 1, wherein the at least one protrusion comprises a light-concentrating arc surface; and
wherein an orthographic projection of a focal point of the light-concentrating arc surface on the substrate is within the orthographic projection of the first channel portion on the substrate.

7. The display panel according to claim 6, wherein the first source electrode comprises a first surface away from the first active layer, and the first drain electrode comprises a second surface away from the first active layer; and
wherein the focal point of the light-concentrating arc surface is coincident with a plane where at least one of the first surface or the second surface is positioned.

8. The display panel according to claim 1, wherein the photosensitive transistor further comprises a gate electrode connected to a first control signal line, the first source electrode of the photosensitive transistor is connected to a first power supply line, and the first drain electrode of the photosensitive transistor is connected to a first electrode of the switch transistor;
wherein a gate electrode of the switch transistor is connected to a second control signal line, and a second electrode of the switch transistor is connected to the readout module; and
wherein the first capacitor comprises a first electrode plate and a second electrode plate, the first electrode plate is connected to the first drain electrode of the photosensitive transistor and the first electrode of the switch transistor, and the second electrode plate is connected to the first control signal line.

9. The display panel according to claim 8, wherein the readout module comprises:
an operational amplifier comprising an inverting input terminal, a non-inverting input terminal, and an output terminal, wherein the non-inverting input terminal is connected to a comparison voltage terminal, and the inverting input terminal is connected to the second electrode of the switch transistor;
a readout capacitor connected in parallel with the operational amplifier; and
a first switch connected in parallel with the operational amplifier and the readout capacitor; and
wherein a first terminal of the readout capacitor and a first terminal of the first switch are connected to the inverting input terminal of the operational amplifier, and a second terminal of the readout capacitor and a second terminal of the first switch are connected to the output terminal of the operational amplifier.

10. A mobile terminal, comprising a terminal body and a display panel, wherein the terminal body and the display panel are combined into one, the display panel comprises a photosensitive module and a readout module connected to the photosensitive module, and the photosensitive module comprises:
a photosensitive transistor comprising a first active layer and a first source-drain electrode layer positioned on the first active layer, wherein the first active layer comprises a first channel portion and first active portions respectively positioned on two sides of the first channel portion, and the first source-drain electrode layer is disposed on the first active portions;
a switch transistor connected to the photosensitive transistor and the readout module;
a first capacitor connected to the photosensitive transistor and the switch transistor; and a light-concentrating structure disposed on the photosensitive transistor, wherein the light-concentrating structure comprises at least one protrusion protruding in a direction from a substrate of the display panel to the photosensitive transistor;

wherein an orthographic projection of the light-concentrating structure on the substrate covers at least an orthographic projection of the first channel portion on the substrate;

wherein the display panel further comprises a display transistor comprising a third active layer and a third source-drain electrode layer disposed on the third active layer, the third active layer comprises a third channel portion and third active portions respectively positioned on two sides of the third channel portion, and the third source-drain electrode layer does not overlap the third channel portion; and wherein the first source-drain electrode layer comprises a first source electrode and a first drain electrode separate from each other, the first source electrode is disposed close to the display transistor, and the first drain electrode is disposed away from the display transistor.

11. The mobile terminal according to claim 10, wherein the at least one protrusion comprises a light-concentrating arc surface; and wherein an orthographic projection of a focal point of the light-concentrating arc surface on the first channel portion substrate is positioned in within the orthographic projection of the first channel portion on the substrate.

12. The mobile terminal according to claim 11, wherein the first source electrode comprises a first surface away from the first active layer, and the first drain electrode comprises a second surface away from the first active layer; and wherein the focal point of the light-concentrating arc surface is coincident with a plane where at least one of the first surface or the second surface are is positioned.

13. The mobile terminal according to claim 10, wherein the switch transistor comprises a second active layer and a second source-drain electrode layer, the second active layer comprises a second channel portion and second active portions respectively positioned on two sides of the second channel portion, and the second source-drain electrode layer does not overlap the second channel portion; and wherein a length of the first channel portion is greater than a length of the second channel portion.

14. The mobile terminal according to claim 10, wherein a length of the first channel portion is greater than a length of the third channel portion.

15. The mobile terminal according to claim 10, wherein a thickness of the first source electrode is greater than a thickness of the first drain electrode in the direction from the substrate to the photosensitive transistor.

16. The mobile terminal according to claim 10, wherein the at least one protrusion comprises a light-concentrating plane and a light-concentrating inclined plane connected with the light-concentrating plane, the light-concentrating inclined plane has a first terminal disposed away from the photosensitive transistor and a second terminal disposed close to the photosensitive transistor, and the first terminal is connected to the light-concentrating plane; and wherein an orthographic projection of the light-concentrating plane on the substrate covers at least the orthographic projection of the first channel portion on the substrate.

17. The mobile terminal according to claim 10, wherein the photosensitive transistor further comprises a gate electrode connected to a first control signal line, the first source electrode of the photosensitive transistor is connected to a first power supply line, and the first drain electrode of the photosensitive transistor is connected to a first electrode of the switch transistor;

wherein a gate electrode of the switch transistor is connected to a second control signal line, and a second electrode of the switch transistor is connected to the readout module; and wherein the first capacitor comprises a first electrode plate and a second electrode plate, the first electrode plate is connected to the first drain electrode of the photosensitive transistor and the first electrode of the switch transistor, and the second electrode plate is connected to the first control signal line.

18. The mobile terminal according to claim 17, wherein the readout module comprises:

an operational amplifier comprising an inverting input terminal, a non-inverting input terminal, and an output terminal, wherein the non-inverting input terminal is connected to a comparison voltage terminal, and the inverting input terminal is connected to the second electrode of the switch transistor;

a readout capacitor connected in parallel with the operational amplifier; and a first switch connected in parallel with the operational amplifier and the readout capacitor; and wherein a first terminal of the readout capacitor and a first terminal of the first switch are connected to the inverting input terminal of the operational amplifier, and a second terminal of the readout capacitor and a second terminal of the first switch are connected to the output terminal of the operational amplifier.

* * * * *